(12) United States Patent
Urban et al.

(10) Patent No.: US 10,120,423 B1
(45) Date of Patent: Nov. 6, 2018

(54) UNIBODY THERMAL ENCLOSURE

(71) Applicant: Amazon Technologies, Inc., Seattle, WA (US)

(72) Inventors: Bradley David Urban, Cupertino, CA (US); Troy Hulick, Saratoga, CA (US); Shelomon Patrick Doblack, Santa Clara, CA (US); Robert Olson, Sunnyvale, CA (US); Albert John Yu Sam Chua, San Jose, CA (US); Daniel Jones, Castro Valley, CA (US); Adam Kenneth Cybart, Morgan Hill, CA (US); Gaurav Soni, Fremont, CA (US); William James Carter-Giannini, San Jose, CA (US); Matthew Michael Seflic, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/849,350

(22) Filed: Sep. 9, 2015

(51) Int. Cl.
| | |
|---|---|
| *H05K 7/20* | (2006.01) |
| *G06F 1/20* | (2006.01) |
| *B29C 65/00* | (2006.01) |
| *B29L 9/00* | (2006.01) |

(52) U.S. Cl.
CPC .......... *G06F 1/20* (2013.01); *B29C 66/73114* (2013.01); *H05K 7/205* (2013.01); *B29L 2009/00* (2013.01)

(58) Field of Classification Search
CPC ..... G06F 1/20; B29C 66/73114; H05K 7/205; B29L 2009/00

USPC .................................................... 361/679.54
See application file for complete search history.

(56) References Cited

U.S. PATENT DOCUMENTS

| | | | | |
|---|---|---|---|---|
| 4,768,286 | A * | 9/1988 | Ketcham ................. | H05K 3/284 29/841 |
| 5,060,114 | A * | 10/1991 | Feinberg ............... | H01L 23/433 165/185 |
| 5,311,402 | A * | 5/1994 | Kobayashi .............. | H01L 21/52 174/17.05 |
| 5,402,313 | A * | 3/1995 | Casperson ......... | H05K 7/20854 165/185 |
| 5,978,221 | A * | 11/1999 | Sawa ................... | H01L 23/3737 165/185 |
| 6,043,981 | A * | 3/2000 | Markow ............. | H01L 23/4006 165/80.3 |
| 6,052,280 | A * | 4/2000 | Dilley ...................... | G06F 1/203 165/104.33 |
| 6,172,871 | B1 * | 1/2001 | Holung ................. | G06F 1/1632 165/104.33 |
| 6,256,201 | B1 * | 7/2001 | Ikeda .................. | F28D 15/0233 165/104.26 |
| 6,324,055 | B1 * | 11/2001 | Kawabe ................ | G06F 1/1616 361/679.54 |

(Continued)

*Primary Examiner* — Anatoly Vortman
(74) *Attorney, Agent, or Firm* — Lee & Hayes, PLLC

(57) ABSTRACT

Described herein are unibody thermal enclosures for electronic devices. In some instances, the enclosure is a unibody structure formed by injecting a structural material into the tool suspending thermal absorbing/spreading material and thermal insulating material within a cavity of the tool. In other instances, the thermal absorbing/spreading material may be exposed to circuitry of the electronic device and the thermal insulating material may be exposed to the exterior of the electronic device.

20 Claims, 6 Drawing Sheets

(56) References Cited

U.S. PATENT DOCUMENTS

| | | | | |
|---|---|---|---|---|
| 6,487,073 B2* | 11/2002 | McCullough | G06F 1/203 | 257/E23.107 |
| 6,690,578 B2* | 2/2004 | Edelmann | H05K 7/20454 | 165/46 |
| 6,775,141 B2* | 8/2004 | Yoshida | H01L 23/42 | 257/707 |
| 6,867,978 B2* | 3/2005 | Whittenburg | H01L 23/3733 | 257/713 |
| 6,870,738 B2* | 3/2005 | Goebl | H01L 24/72 | 257/E23.078 |
| 6,980,436 B2* | 12/2005 | Chen | G06F 1/20 | 165/104.33 |
| 7,006,354 B2* | 2/2006 | Mochizuki | H01L 23/373 | 165/185 |
| 7,031,162 B2* | 4/2006 | Arvelo | H01L 23/3675 | 257/707 |
| 7,063,127 B2* | 6/2006 | Gelorme | H01L 23/433 | 165/185 |
| 7,078,109 B2* | 7/2006 | Hill | H01L 23/4275 | 228/179.1 |
| 7,242,585 B2* | 7/2007 | Fukuma | G06F 1/1616 | 257/713 |
| 7,330,356 B2* | 2/2008 | Park | G06F 1/203 | 361/688 |
| 7,352,582 B2* | 4/2008 | Yokoyama | H01L 51/5243 | 361/679.48 |
| 7,394,659 B2* | 7/2008 | Colgan | H01L 23/42 | 257/706 |
| 7,468,886 B2* | 12/2008 | Coico | H01L 21/4871 | 257/713 |
| 7,525,804 B2* | 4/2009 | Tetsuka | H01L 21/6835 | 29/890.035 |
| 7,561,427 B2* | 7/2009 | Jeong | H05K 7/20963 | 361/690 |
| 7,576,988 B2* | 8/2009 | Schwarz | H05K 7/20472 | 361/704 |
| 8,004,844 B2* | 8/2011 | Kim | H05K 7/20409 | 361/714 |
| 8,014,152 B2* | 9/2011 | Nishiuma | H05K 7/20481 | 165/80.2 |
| 8,059,409 B2* | 11/2011 | Steenwyk | H05K 7/20545 | 361/697 |
| 8,139,376 B2* | 3/2012 | Sanroma | H05K 5/061 | 174/350 |
| 8,325,483 B2* | 12/2012 | Kondoh | H04B 1/036 | 361/679.54 |
| 8,526,184 B2* | 9/2013 | Sullivan | H05K 7/1404 | 165/80.2 |
| 8,587,945 B1* | 11/2013 | Hartmann | H05K 7/20454 | 361/679.53 |
| 8,625,282 B2* | 1/2014 | Chen | H05K 7/2039 | 361/679.46 |
| 9,137,928 B2* | 9/2015 | Chen | H05K 7/2039 | |
| 9,357,665 B2* | 5/2016 | Myers | G06F 1/1626 | |
| 9,480,185 B2* | 10/2016 | Linderman | H05K 1/0203 | |
| 9,575,523 B2* | 2/2017 | Jenkins | G06F 1/203 | |
| 2003/0066672 A1* | 4/2003 | Watchko | C23C 4/00 | 174/50 |

* cited by examiner

UNIBODY THERMAL ENCLOSURE

BACKGROUND

A large and growing population of users is enjoying entertainment through the consumption of digital content, such as music, movies, images, electronic books, and so on. The users employ various devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth to stream the digital content. In many cases, the processing associated with streaming content to a device is both intensive and continuous resulting in the devices generating greater than normal amounts of heat, which can cause the exterior of the device to be warm or hot to the touch.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
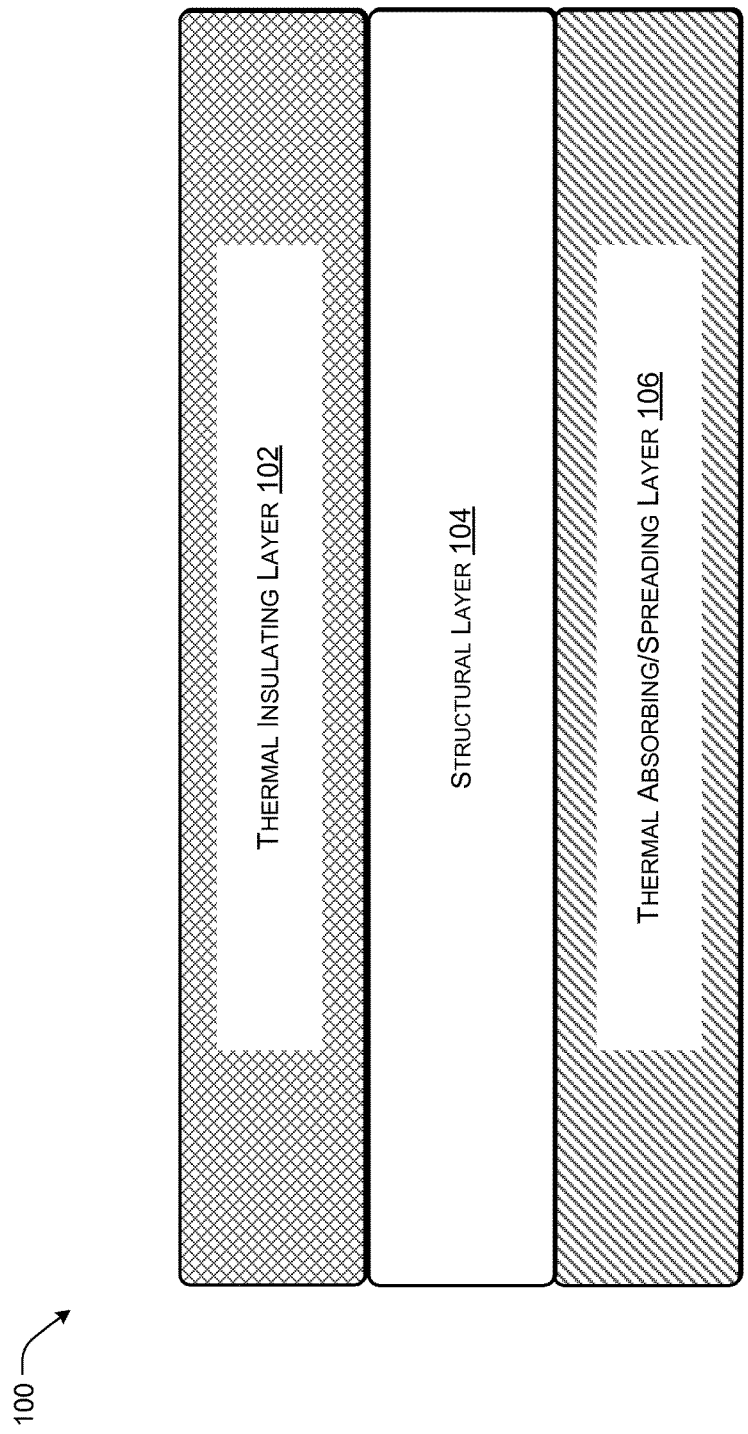
FIG. 1 illustrates an example schematic cross-section of a thermal enclosure for an electronic device.

This disclosure describes, in part, electronic devices that include electronic displays for displaying digital content to one or more users. In some particular examples, this disclosure describes ways to provide an electronic device having a unibody thermal enclosure that remains cool to the touch during periods of intensive processing. For instance, many electronic devices are utilized to stream electric media content from a remote server system. In some areas, specialized devices design solely for the purpose of streaming electronic media content are being widely adapted. However, streaming electronic media content is often a resource intensive task that is performed by the device for an extended continuous period of time. For example, an individual user may stream a movie that may result in a continuous processing task for various components of the electronic device for several hours. During the processing, the various components, (e.g., communication interfaces/circuits, general processing units, graphical processing units, etc.) may generate large amounts of heat causing the device to become hot to the touch.

In some examples describe herein, a unibody thermal enclosure is described. The thermal enclosure may be configured to include at least three layers of different materials. For instance, the enclosure may include a first layer of thermal material, such as a heat sink to absorb the heat and/or conductive metal to spread the heat and thereby manage thermal hot spots within the device. A second layer of structural material may be placed atop the thermal layer to provide rigidity and stiffness to the overall electronic device to prevent the device from bending or deforming during use. A third layer of thermal insulating material, such as foam, rubber, or wood, may be placed atop the structure layer to reduce the impact of surface temperatures on a user of the device.

In some instances, the thermal enclosure may be formed by injection molding. For example, thermal insulating materials may be positioned within a tool from a first direction, heat spreading and/or absorbing materials may be positioned within the tool from a second direction. In general, the heat absorbing materials may act as a heat sink to absorb and contain the heat generated by the device away from heat sensitive components and/or the user. Similarly, the heat spreading material acts to absorb heat and to disperse the heat evenly throughout the device. For example, the thermal insulating materials may be include from zinc, aluminum, copper, copper based allows, magnesium, graphite, or other materials known to absorb and/or isolate. In some cases, the heat spreading and/or absorbing materials may include aluminum, copper, copper based allows, or other materials known to spread heat.

Once both the thermal insulating materials and the heat spreading and/or absorbing materials are positioned within the tool, the tool may be sealed and filed with a structural material, such as a plastic, thermal plastic, thermal set material, polymer, or elastomer. The plastic or polymer may be allowed to set or cured using, for example, by ultraviolate (UV) radiation. Thus, in some instances, the resulting enclosure may be a unibody design that requires no additional adhesives or lamination.

In some cases, the thermal enclosure may be formed in various shapes to accommodate different types of electronic devices. For example, the enclosure may include molded snaps, hooks, or other connectors formed from the structure material using the tool. In these cases, the electronic components may be configured to snap, hook, or otherwise lock in place without the necessity of additional assembly steps.

In another instances, the thermal enclosure may be laminated to form a unibody structure. For example, a substrate may be provided as the structural support layer or element. A layer of adhesive may be placed over a top surface of the substrate and the thermal insulating material may be contacted onto the adhesive. A second layer of adhesive may be placed over a bottom surface of the substrate and the heat absorbing/spreading material may be contacted onto the adhesive. In some cases, the adhesives may be cured for example, using a heat lamp, UV radiation, pressure, or a combination thereof. In some cases, the enclosure may be formed under pressure in a vacuum chamber.

FIG. 1 illustrates an example schematic cross-section of a thermal enclosure 100 for an electronic device. In the illustrative example, the enclosure 100 includes three layers of material stacked upon each other. The enclosure 100 is designed as a unibody enclosure having predetermined thermal properties to absorb, spread, or prevent exposure of heat to a user of the electronic device. For example, the enclosure may be configure to maintain an external temperature below a predefined amount (such as 48° C. or 50° C.) or an operating temperate (such as 85° C.). In other examples, the enclosure may be configured to prevent an external temperature from exceed a predefined amount (such as 48° C. or 50° C.) for more than a predefined period of time (such as 10 minutes). In particular, the enclosure may be designed to absorb, spread, or prevent exposure of heat to a user during resource intensive tasks such as streaming electronic media content, such as television, movies, games, and other interactive graphically intense media, from a remote system.

In the illustrative example, the first layer is a thermal insulting layer 102. The thermal insulating layer 102 may be an exterior layer of the enclosure 100 that is intended to be exposed to a user of the device and/or an environment. In some cases, one or more materials associated with the thermal insulating layer 102 may be selected to reduce the impact of surface temperature on the user. For example, the thermal insulating layer 102 may include materials such as foam, rubber, plastic, or wood (e.g., balsam wood) that generally resist the transfer or conduction of heat. Thus, the thermal insulating layer 102 may be provided to both offer an exterior surface that is pleasing to a user's touch and to resist the transfer of heat out of the electric device at areas in which the user is likely to come in contact with the device.

The second layer is a structural layer 104. In some cases, the structural layer 104 may be formed from a material to provide rigidity and stiffness to the overall electronic device to prevent the device from bending or deforming during use. For structural layer 104 may be formed from a plastic or a glass. In some implementations, the structural layer 104 may be formed by injecting a liquid or heated version of the material into a tool and curing. Thus, in these implementations the structural layer 104 may be formed in different shapes and include various elements, such as snaps, hooks, slots, loops, trays, or other connectors for attaching additional components of the electronic device, such as one or more circuit boards.

The third layer is a heat absorbing/spreading layer 106. The heat absorbing/spreading layer 106 may include various materials to either absorb heat or spread heat through the device. For example, the heat absorbing/spreading layer 106 may include a zinc component located over a particular location that generates a large percentage of heat (or hot spot) to absorb heat generated by a particular component of the electronic device. The heat absorbing/spreading layer 106 may also include an additional or alternative metal material such as copper or aluminum to spread the heat from the hot spot to other areas of the electronic device to thereby reduce the impact of heat at the particular location and allow the heat to dissipate over a greater area.

Figure 2:
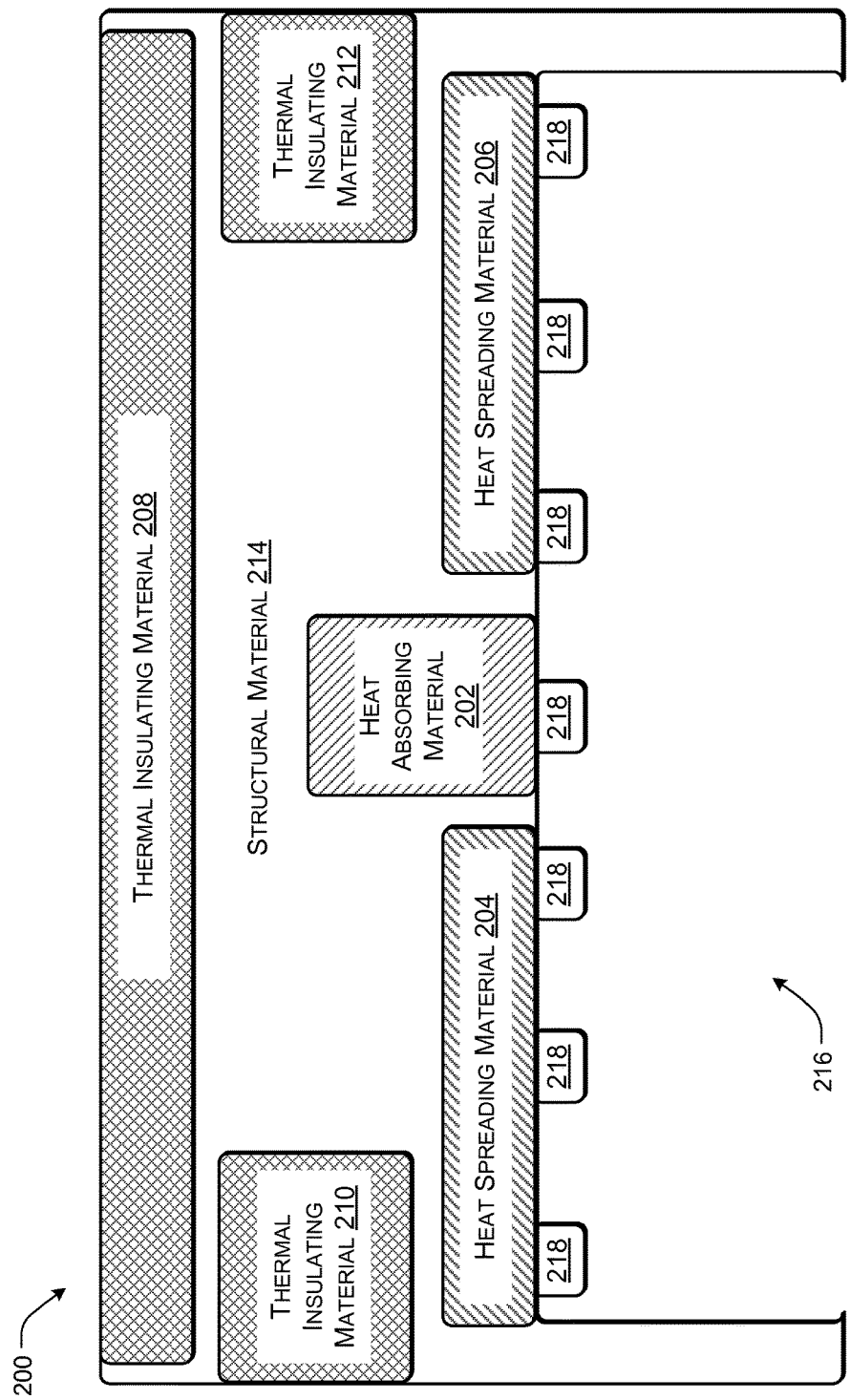
FIG. 2 illustrates another example schematic cross-section of a thermal enclosure for an electronic device.

FIG. 2 illustrates another example schematic cross-section of a thermal enclosure 200 for an electronic device. In the illustrative example, the enclosure 200 includes a unibody structure formed from various materials, including the heat absorbing material 202, heat spreading material 204 and 206, thermal insulating material 208, 210 and 212, and structural material 214. The various materials of the enclosure 200 may allow the enclosure 200 to have predetermined thermal properties to absorb, spread, or prevent exposure of heat to a user of the electronic device. In particular, the enclosure may be designed to absorb, spread, or prevent exposure of heat to a user during resource intensive tasks such as streaming electronic media content, such as television, movies, games, and other interactive graphically intense media, from a remote system.

In the illustrative example, the enclosure 200 may be formed as a single unibody structure including an opening 216 for receiving other components of the electronic device, such as internal circuitry, communication interfaces, and/or processors for streaming electronic content. Additionally, in some examples, the enclosure 200 may include various snaps, hooks, latches, or other connectors 218 for connecting the enclosure to the other components placed within the opening 216.

In some cases, the thermal insulating materials 208, 210, and 212 may be selected to reduce the impact of surface temperature on the user. For example, the thermal insulating materials 208, 210, and 212 may include materials such as foam, rubber, plastic, or wood (e.g., balsam wood) that generally resist the transfer or conduction of heat. In the illustrated example, the thermal insulting material 208, 210, and 212 is positioned around the exterior layer of the enclosure 200 at locations in which in a user of the device is likely to come in contact with the enclosure 200. Thus, the thermal insulating materials 208, 210, and 212 may be provided to both offer an exterior surface that is pleasing to a user's touch and to resist the transfer of heat out of the electric device at areas in which the user is likely to come in contact with the device. In some instances, each of the thermal insulating materials 208, 210, and 212 may be formed form the same material, while in other instances, each of the thermal insulating materials 208, 210, and 212 may be formed from two or more different materials.

The heat spreading materials 204 and 206 may include various materials to spread heat through the device, such as copper or aluminum. For example, by spreading heat from a hot spot to other areas of the electronic device, the overall effect of the heat is less apparent at any one particular location of the enclosure 200 and the heat may be more quickly dissipated. In some cases, in addition to the heat spreading materials 204 and 206, a heat absorbing material 202 may be incorporated into the enclosure. The heat absorbing material 202 may be located over a particular resource or component of the device to absorb heat generated by the particular resource or component and thereby reduce the overall effect of the heat on the exterior surface of the enclosure 200. In some particular examples, the heat spreading materials 204 and 206 may be positioned with respect to the heat absorbing material 202 to transfer or spread heat absorb by the heat absorbing material 202 to other areas of the enclosure 200 to assist in dissipating the heat stored within the device.

The structural material 214 may be formed from a material to provide rigidity and stiffness to the overall electronic device to prevent the device from bending or deforming during use. In some cases, the structural material 214 may be selected to provide a predetermined hardness rating, for example, the structural material 214 may be a plastic or a glass. In the illustrated example, the structural material 214 is located around the heat absorbing material 202, the heat spreading material 204 and 206, and the thermal insulating material 208, 210, and 212. For instance, enclosure 200 may be formed by injecting the structural material 214 into a tool around the heat absorbing material 202, the heat spreading material 204 and 206, and the thermal insulating material 208, 210, and 212 and curing. Thus, in these implementations the structural material 214 may be utilized to form the enclosure 200 in different shapes and include various elements, such as snaps, hooks, slots, loops, trays, or other connectors 218 for attaching additional components of the electronic device, such as one or more circuit boards.

In some examples, by forming the enclosure 200 as a unibody part via an injection molding process, the overall cost may be reduce while the overall yields are increased. For example, issues caused during assembly of the electronic device, such as defaults caused by applying adhesives to the heat absorbing material 202, the heat spreading material 204 and 206, and the thermal insulating material 208, 210, and 212 may be minimized and/or eliminated.

Figure 3:
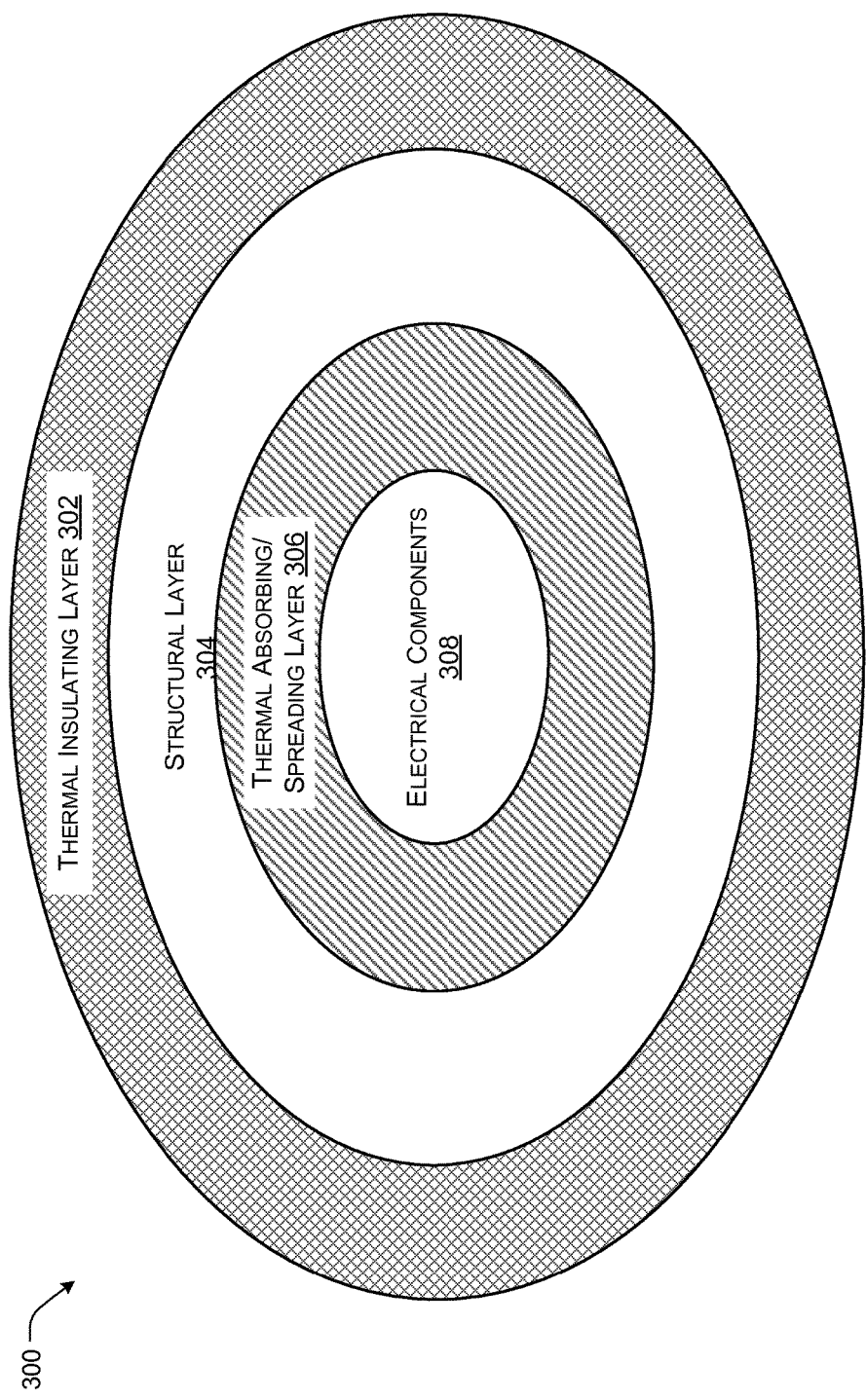
FIG. 3 illustrates yet another example schematic cross-section of a thermal enclosure for an electronic device.

FIG. 3 illustrates yet another example schematic cross-section of a thermal enclosure 300 for an electronic device. In the illustrated example, the enclosure 300 is a generally cylindrical shaped enclosure having an exterior thermal insulating layer 302, a structural layer 304, and a heat absorbing/spreading layer 306. For example, single purpose dedicated electronic content streaming devices have become available from various manufactures. In some cases, these dedicated streaming devices are embodied as a universal serial bus (USB) fob, interface, or stick capable of releasable coupling to a television, computer, tablet, or other electronic device. Thus, in some implementations, a large percentage of outer surface of the device may be contacted by a user, for example, removing the USB fob from a television interface. In these implementations, the electrical components 308 may be encased within the enclosure 300 as illustrated.

Figure 4:
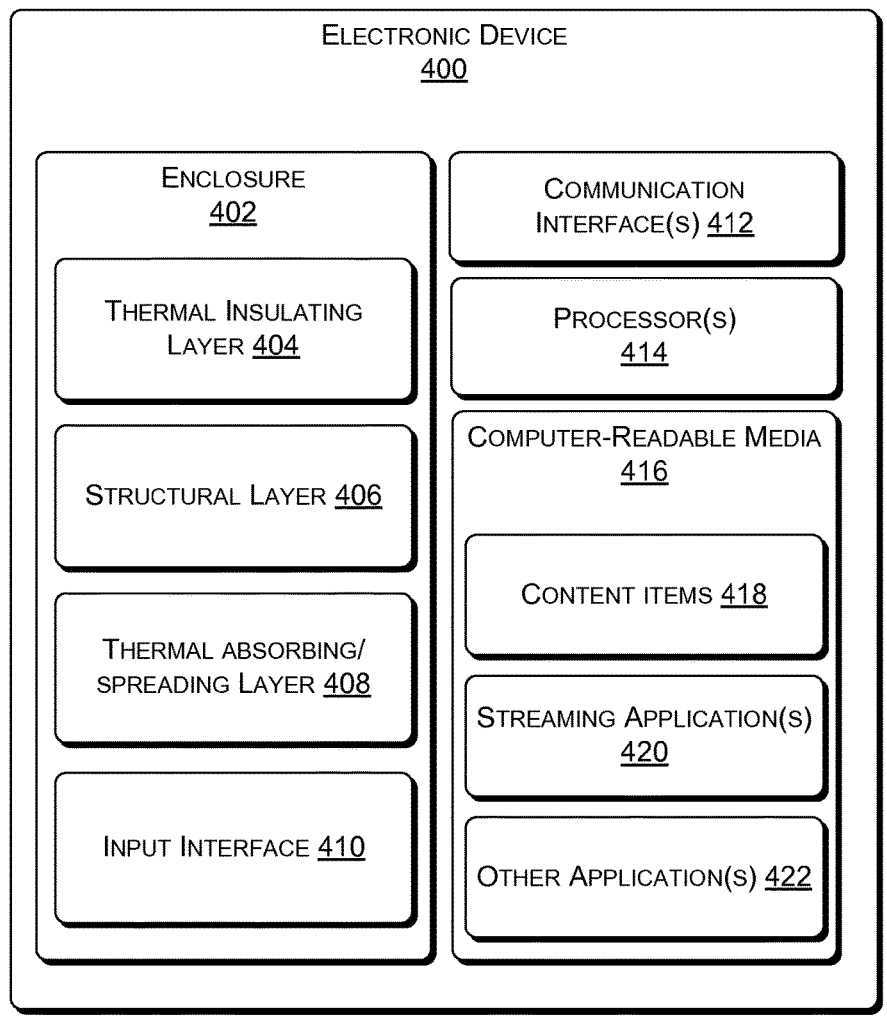
FIG. 4 illustrates an example electronic device including an enclosure associated with FIGS. 1-3.

FIG. 4 illustrates an example electronic device 400 including an enclosure associated with FIGS. 1-3. The electronic device 400 may comprise any type of electronic device (e.g., an electronic book reader, a tablet computing device, a laptop computer, a multifunction communication device, a portable digital assistant (PDA), etc.) or non-mobile electronic device (e.g., a desktop computer), a television, specialize streaming device, etc.). In addition, while FIG. 4 illustrates several example components of the electronic device 400, it should be appreciated that the electronic device 400 may also include other conventional components, such as an operating system, system busses, input/output components, and the like.

In the illustrated example, the device 400 includes an enclosure 402. The enclosure 402 includes a thermal insulating layer 404, a structural layer 406, a heat absorbing/spreading layer 408, and an input interface 410. The thermal insulting layer 102. The thermal insulating layer 404 may be an exterior layer of the enclosure 402 that is intended to be exposed to a user of the device and/or an environment. In some cases, one or more materials associated with the thermal insulating layer 404 may be selected to reduce the impact of surface temperature on the user. For example, the thermal insulating layer 404 may include materials such as foam, rubber, plastic, or wood (e.g., balsam wood) that generally resist the transfer or conduction of heat. Thus, the thermal insulating layer 404 may be provided to both offer an exterior surface that is pleasing to a user's touch and to resist the transfer of heat out of the electric device at areas in which the user is likely to come in contact with the device.

The structural layer 406. In some cases, the structural layer 406 may be formed from a material to provide rigidity and stiffness to the overall electronic device to prevent the device from bending or deforming during use. For structural layer 406 may be formed from a plastic or a glass. In some implementations, the structural layer 406 may be formed by injecting a material into a tool and curing. Thus, in these implementations the structural layer 406 may be formed in different shapes and include various elements, such as snaps, hooks, slots, loops, trays, or other connectors for attaching additional components of the electronic device, such as one or more circuit boards.

The heat absorbing/spreading layer 408 may include various materials to either absorb heat or spread heat through the device. For example, the heat absorbing/spreading layer 408 may include a zinc component located over a particular location that generates a large percentage of heat (or hot spot) to absorb heat generated by a particular component of the electronic device. The heat absorbing/spreading layer 408 may also include an additional or alternative metal material such as copper or aluminum to spread the heat from the hot spot to other areas of the electronic device to thereby reduce the impact of heat at the particular location and allow the heat to dissipate over a greater area.

The user interface 410 may be one or more buttons or touch components to allow a user to control the device 400. For example, the user interface 410 may include a touch-sensitive display that is capable of both accepting user input and displaying content corresponding to the input, one or more capacitive touch sensor, Force sensitive resistor, or any other type of sensor.

The electronic device 400 may also include one or more communication interfaces 412 to facilitate communication between one or more networks (such as the Internet or one or more local area networks) and/or directly with one or more devices. The communication interfaces 412 may also facilitate communication between one or more wireless access points, a master device, and/or one or more other computing devices as part of an ad-hoc or home network system. The communication interfaces 412 may support both wired and wireless connection to various networks, such as cellular networks, radio, WiFi networks, short-range or near-field networks (e.g., Bluetooth®), infrared signals, local area networks, wide area networks, the Internet, and so forth. In one particular example, the communication interface 412 may be a wireless communication interface configured to connect to one or more remote systems to stream content to the device 400 or a secondary device coupled to the device 400.

The electronic device 400 also includes one or more processors 414 and computer-readable media 416. Depending on the configuration of the electronic device 400, the computer-readable media 416 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 414.

The computer-readable media 416 may be used to store any number of functional components that are executable on the processors 414, as well as content items 418, streaming application 420, as well as other applications 422 (such as an operating system). Thus, the computer-readable media 416 may include an operating system and a storage database to store one or more content items 418, such as eBooks, audio books, songs, videos, still images, and the like. The computer-readable media 416 of the electronic device 400 may also store one or more content presentation applications, such as streaming application 420, to display content on the device 400 or a display coupled to the device 400. The stream applications 420 may be implemented in various ways depending upon the content items 418. For instance, one of the streaming applications 420 may include be an electronic book reader application for rendering textual electronic books, an audio player for playing audio books or songs, a video player for playing video, and so forth.

Figure 5:
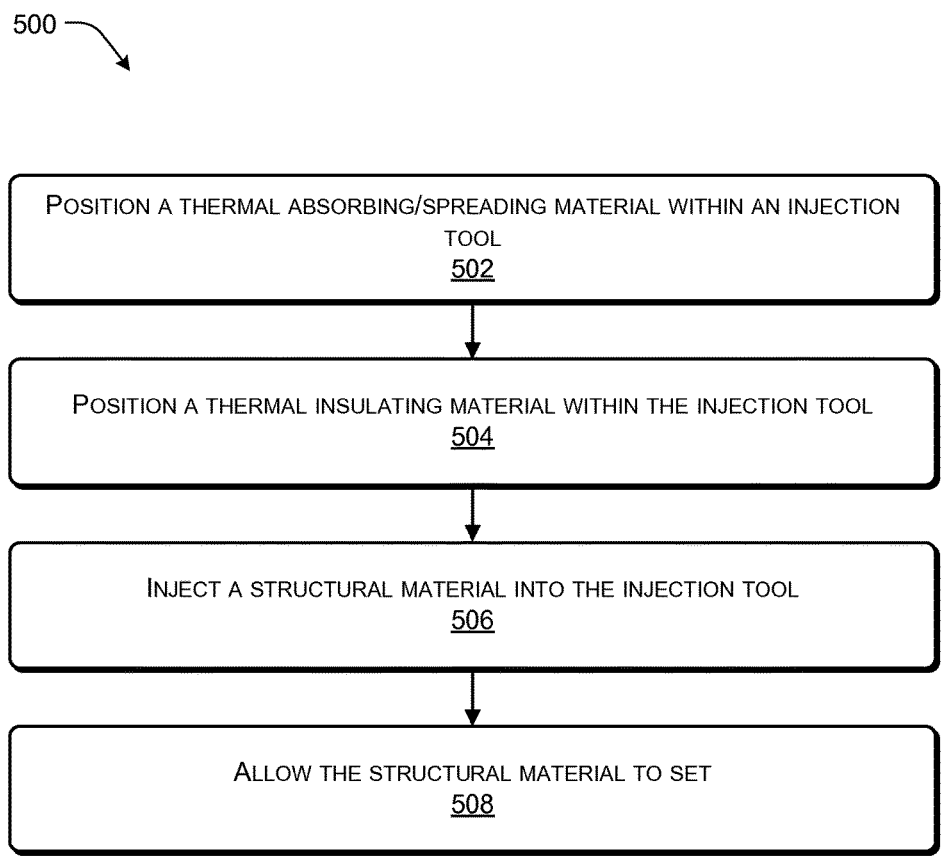
FIG. 5 illustrates an example flow diagram showing an illustrative process for forming a unibody thermal enclosure.
Figure 6:
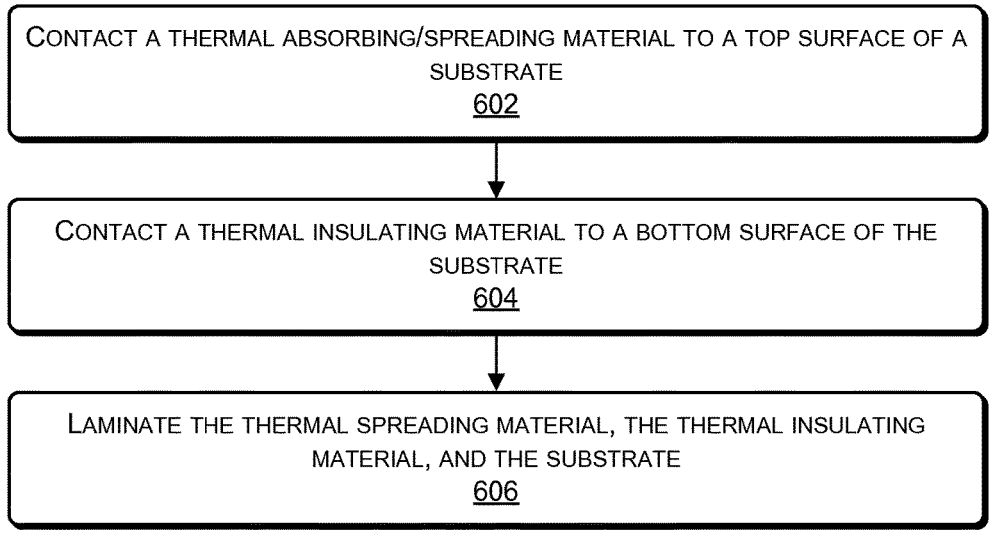
FIG. 6 illustrates another example flow diagram showing an illustrative process for forming a unibody thermal enclosure.

FIGS. 5 and 6 are flow diagrams illustrating example processes for forming an enclosure as described above. The processes are illustrated as a collection of blocks in a logical flow diagram, which represent a sequence of operations or processes.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 5 illustrates an example flow diagram showing an illustrative process 500 for forming a unibody thermal enclosure. In the illustrated example, the unibody enclosure is formed by injection molding a plastic polymer, elastomer, thermal set, or other structural material into a tool while the other materials, e.g., the thermal insulating and heat absorbing/spreading materials are held in place, such as via a water soluble or dispersible material that dissolves as the structural material is injected into the tool.

At 502, a heat absorbing/spreading material is positioned within a tool. For example, the heat absorbing/spreading material may be placed within the tool from a first direction and suspended at the desired positioned by water soluble or dispersible material. In some cases, multiple heat absorbing/spreading material components may be positioned within the tool.

At 504, a thermal insulating material is positioned within the tool. For example, while the heat absorbing/spreading material may be positioned within the tool from the first direction, the thermal insulating material may be positioned within the tool from a section direction. Similar to the heat absorbing/spreading material, the thermal insulating material may be suspended at the desired positioned by water soluble or dispersible material. For instance, the thermal insulating material may be suspended via a dissolvable material which dissolves as the structural material is injected into the tool, while maintaining the thermal insulating material (such as balsam wood) at a desired temperature to prevent the thermal insulating material from deforming during the injection molding process 500.

At 506, a structural material (such as a glass, elastomer, silicon, or a plastic polymer such as a thermoplastic polymer and/or a thermosetting polymer) is injected into the tool. The structural material may be heated and/or include a component that causes the substance (e.g., the water soluble material) suspending the heat absorbing/spreading martial and the thermal insulating martial to dissolve or dissipate, such that the structural material may fill the entirety of the space within the tool except for the space filled by the heat absorbing/spreading martial and the thermal insulating martial. In one example, the structural material may be placed into a heated barrel or hopper until the structural material maintains a liquid or viscous states and then forced into the cavity of the tool. In one particular example, the structural material may be a thermal set formed via a chemical reaction of two or more materials placed into a heated barrel or hopper and mixed to cause a chemical reaction. In some cases, the structural material may be injected into the tool using a ram or plunger under pressure.

At 508, the structural material within the tool is allowed to set. For example, the structural material may be cooled, exposed to UV radiation, and/or a heat lamp. Once, the structural material is cured, the tool may be removed and the resulting unibody enclosure may be transferred to an assembly area for attaching the electronic components.

FIG. 6 illustrates another example flow diagram showing an illustrative process for forming a unibody thermal enclosure. In the illustrated example, the unibody enclosure is formed by laminating the thermal insulating, the heat absorbing/spreading material, and the structural material together to form a unibody structure.

At 602, a heat absorbing/spreading material may be contacted on to a top surface of a substrate. In some cases, the substrate may be formed form the structural material, such as glass, elastomer, or plastic polymer. In some examples, the substrate may be configured to provide a rigidity, stiffness, and/or hardness to the enclosure. In one example, a layer of liquid or solid adhesive may be placed between the heat absorbing/spreading material and the top surface of the substrate. The adhesive may then be cured via a heat lamp or UV treatment.

At 604, a thermal insulating material may be contacted on to a bottom surface of the substrate. In one example, a layer of liquid or solid adhesive may be placed between the thermal insulating material and the bottom surface of the substrate. The adhesive may then be cured via a heat lamp or UV treatment.

At 606, the thermal insulating material, thermal absorbing/spreading material, and the substrate may be laminated into a unibody structure. For example, the enclosure may be placed into a vacuum chamber and a pressure may be applied to the thermal absorbing/spreading material, the thermal insulating material, the substrate, and the layers of adhesive. The pressure may be applied while the adhesive is cured to form a single enclosure structure.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. An enclosure comprising:
   a thermal insulating material positioned proximate to a surface of the enclosure exposed to an external environment;
   a structural material in contact with the thermal insulating material, the structural material and the thermal insulating material forming a single unibody component; and
   a heat absorbing material disposed substantially laterally between two portions of a heat spreading material such that the heat absorbing material and the two portions of the heat spreading material are disposed within a single layer that is disposed on an interior surface of the enclosure, and wherein the heat absorbing material includes a first metal that is different from a second metal of the heat spreading material.

2. The enclosure as recited in claim 1, wherein the two portions of the heat spreading material are positioned proximate to at least one internal electronic component, and the heat spreading material is integral with the structural material.

3. The enclosure as recited in claim 1, wherein the heat spreading material includes at least one of:

copper;
aluminum; or
copper based alloy.

4. The enclosure as recited in claim 1, wherein the heat absorbing material is positioned proximate to at least one internal electronic component, and the heat absorbing material is integral with the structural material.

5. The enclosure as recited in claim 1, wherein the heat absorbing material includes at least one of:
graphite;
magnesium; or
zinc.

6. The enclosure as recited in claim 1, wherein the structural material is a thermal set material.

7. The enclosure as recited in claim 1, wherein the structural material is a thermal plastic.

8. The enclosure as recited in claim 1, wherein the thermal insulating material is exposed to the external environment.

9. The enclosure as recited in claim 1, wherein the thermal insulating material includes at least one of:
balsam wood;
plastic polymer;
rubber; or
foam.

10. The electronic device as recited in claim 1, wherein the thermal insulating material remains below 50° C. during use of at least one internal electronic component proximate to the heat absorbing material.

11. The enclosure as recited in claim 1, wherein:
the enclosure further comprises a first additional surface and a second additional surface, the first additional surface and the second additional surface disposed substantially perpendicular with respect to the surface of the enclosure exposed to the external environment and the first additional surface being disposed substantially parallel to the second additional surface;
the thermal insulating material is disposed on at least a portion of the first additional surface and a portion of the second additional surface; and
the structural material is disposed between the thermal insulating material and the single layer including the heat absorbing material and the two portions of the heat spreading material.

12. A unibody thermal enclosure comprising:
an exterior surface including a thermal insulating material, the exterior surface exposed to an external environment;
an interior surface, at least a portion of the interior surface including a heat spreading material and a heat absorbing material, wherein the heat spreading material and the heat absorbing material are disposed substantially laterally in a single layer on the interior surface and the heat absorbing material includes a first metal that is different from a second metal of the heat spreading material; and
a structural material disposed around and in contact with the thermal insulating material, the heat spreading material, and the heat absorbing material.

13. The unibody thermal enclosure as recited in claim 12, wherein the structural material is a thermal plastic material.

14. The unibody thermal enclosure as recited in claim 12, wherein the thermal insulating material remains below a first temperature during use of the unibody thermal enclosure.

15. The unibody thermal enclosure as recited in claim 14, wherein the heat absorbing material is disposed over a portion of the interior surface that corresponds to a hot spot that includes circuitry of an electronic device.

16. The unibody thermal enclosure as recited in claim 15, wherein the thermal insulating material causes the circuitry to remain below a second temperature, the second temperature being higher than the first temperature.

17. The unibody thermal enclosure as recited in claim 14, wherein the thermal insulting material remains below 50° C. during use of circuitry proximate to the heat absorbing material.

18. The unibody thermal enclosure as recited in claim 12, wherein the first metal includes zinc and the second metal includes copper or aluminum.

19. An enclosure comprising:
an external surface exposed to an external environment;
a thermal insulating material proximate to the external surface;
an internal surface proximate to an internal electronic component;
a heat absorbing material disposed substantially laterally between two portions of a heat spreading material such that the heat absorbing material and the heat spreading material are disposed in a single layer on the internal surface; and
a structural material in contact with the thermal insulating material, the structural material and the thermal insulating material forming a single unibody component.

20. The enclosure as recited in claim 19, wherein the heat absorbing material includes a first metal that is different from a second metal of the heat spreading material.

* * * * *